United States Patent
Kwon

(10) Patent No.: US 7,696,796 B2
(45) Date of Patent: Apr. 13, 2010

(54) INITIALIZATION SIGNAL GENERATING CIRCUIT

(75) Inventor: Tae Woo Kwon, Gyeongsangnam-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 53 days.

(21) Appl. No.: 12/005,493

(22) Filed: Dec. 27, 2007

(65) Prior Publication Data

US 2008/0238501 A1 Oct. 2, 2008

(30) Foreign Application Priority Data

Apr. 2, 2007 (KR) .................... 10-2007-0032313

(51) Int. Cl.
*H03L 7/00* (2006.01)
(52) U.S. Cl. ...................................... 327/143; 327/198
(58) Field of Classification Search .......... 327/142.143, 327/198
See application file for complete search history.

(56) References Cited

U.S. PATENT DOCUMENTS

| | | | |
|---|---|---|---|
| 5,467,039 A | 11/1995 | Bae | |
| 5,914,901 A | 6/1999 | Pascucci | |
| 6,144,237 A * | 11/2000 | Ikezaki | 327/143 |
| 6,744,291 B2 * | 6/2004 | Payne et al. | 327/143 |
| 6,809,565 B2 * | 10/2004 | Kawakubo | 327/143 |
| 6,914,461 B2 * | 7/2005 | Kwon | 327/143 |
| 7,199,623 B2 * | 4/2007 | Kwon | 327/143 |
| 7,212,046 B2 * | 5/2007 | Hur | 327/143 |
| 2005/0280450 A1 * | 12/2005 | Shin et al. | 327/143 |
| 2008/0100351 A1 * | 5/2008 | Choi | 327/143 |

* cited by examiner

*Primary Examiner*—Lincoln Donovan
*Assistant Examiner*—Ryan C Jager
(74) *Attorney, Agent, or Firm*—John P. White; Cooper & Dunham LLP

(57) ABSTRACT

An initialization signal generating circuit includes a voltage distributor, a first initialization signal generator, a second initialization signal, and a controller. The voltage distributor outputs a voltage signal in response to an external voltage. The first initialization signal generator outputs a first initialization signal in response to the voltage signal output from the voltage distributor. The second initialization signal generator outputs a second initialization signal in response to the voltage signal output from the voltage distributor. The controller blocks the external voltage supplied to the voltage distributor and the first and second initialization signal generators, in response to the first and second initialization signals.

18 Claims, 8 Drawing Sheets

INITIALIZATION SIGNAL GENERATING CIRCUIT

BACKGROUND

The present disclosure relates to a semiconductor device, and more particularly, to an initialization signal generating circuit that initializes an internal circuit by generating an initialization signal thereto and generates various internal voltages.

A conventional initialization signal generating circuit in a semiconductor device generates an initialization signal to initialize a semiconductor chip. An external voltage is applied from the outside to operate the semiconductor chip, starting at approximately 0 V and increasing up to a target voltage level with a predetermined slope.

All circuits in the semiconductor chip may malfunction due to the influence of an increase in an external voltage when directly receiving the external voltage. Accordingly, in order to prevent malfunctions of semiconductor chips, semiconductor devices employ initialization signal generating circuits. Therefore, an external voltage VDD can be applied to each circuit after increasing and reaching a predetermined and stable voltage level.

FIG. 1 illustrates a block diagram of a conventional initialization signal generating circuit. FIG. 2 illustrates a circuit diagram of the conventional initialization signal generating circuit shown in FIG. 1. FIGS. 3 and 4 illustrate operation waveforms of the circuit shown in FIG. 2.

Referring to FIG. 1, the conventional initialization signal generating circuit includes a voltage distributor 110 distributing an external voltage, and an initialization signal generator 120 outputting an initialization signal pwrup_old in response to a voltage signal output from the voltage distributor 110.

Referring to FIG. 2, the voltage distributor 110 includes a first resistor R1 disposed between an external voltage terminal VEXT1 and a first node b, and a second resistor R2 disposed between the first node b and a ground terminal VSS.

The initialization signal generator 120 includes a pull-down part N1 pulling down a second node a in response to an output signal of the voltage distributor 110, a pull-up part P1 pulling up the second node a in response to a ground voltage signal VSS, and an inverter INV1 inverting output signals of the pull-down part N1 and the pull-up part P1.

The conventional initialization signal generating circuit initializes an internal circuit by utilizing the initialization signal pwrup_old when reaching an internal operation start voltage (e.g., approximately 1.2 V) in a case where the external voltage VEXT1 is applied from approximately 0 V to a predetermined value (e.g., approximately 2 V/approximately 200 µs) according to product specifications, and then generates various internal voltages. The initialization signal pwrup_old must maintain a low or high logic level during a predetermined interval before reaching approximately 1.2 V. In FIGS. 2 to 4, the initialization signal is at a low level.

As illustrated in FIGS. 2 to 4, once the external voltage is applied, a current supplied through the pull-up part P1 makes the second node high, and the initialization signal pwrup_old is at a low level.

When the external voltage is approximately 1.2 V, a level of a first node b becomes high to turn on the pull-down part N1, and thus the pull-up part P1 and the pull-down part N1 are all turned on. After a while, the second node a maintains a low level. At this point, the initialization signal becomes high to complete an initialization operation.

However, as illustrated in FIG. 2, the initialization signal generating circuit continuously consumes a predetermined amount of a current through the pull-up part P1 and the pull-down part N1, which are all turned on simultaneously while distributing a voltage, and maintains the initialization signal pwrup_old. As a result, there is a drawback in power consumption.

BRIEF SUMMARY

Various aspects of the present disclosure are directed to an initialization signal generating circuit applying an initialization signal to an internal circuit for initialization, and generating various internal voltages.

In an aspect of the present disclosure, an initialization signal generating circuit includes a voltage distributor configured to output a voltage signal in response to an external voltage, a first initialization signal generator outputting a first initialization signal in response to the voltage signal output from the voltage distributor, a second initialization signal generator outputting a second initialization signal in response to the voltage signal output from the voltage distributor, and a controller configured to block the external voltage supplied to the voltage distributor and the first and second initialization signal generators in response to the first and second initialization signals.

The second initialization signal may be activated after an elapse of a predetermined interval, following the first initialization signal.

In another embodiment, an initialization signal generating circuit includes a voltage distributor configured to output a voltage signal in response to an external voltage, an initialization signal generator outputting an initialization signal in response to the voltage signal output from the voltage distributor, and a controller configured to block the external voltage supplied to the voltage distributor and the initialization signal generator in response to the initialization signal.

DESCRIPTION OF SPECIFIC EMBODIMENTS

Hereinafter, an initialization signal generating circuit in accordance with examples and exemplary embodiments of the present disclosure will be described in detail with reference to the accompanying drawings.

Figure 1:
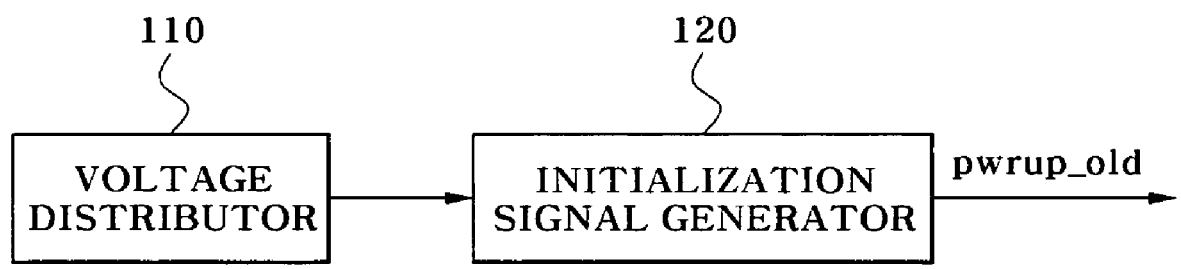
FIG. 1 illustrates a block diagram of a conventional initialization signal generating circuit.
Figure 2:
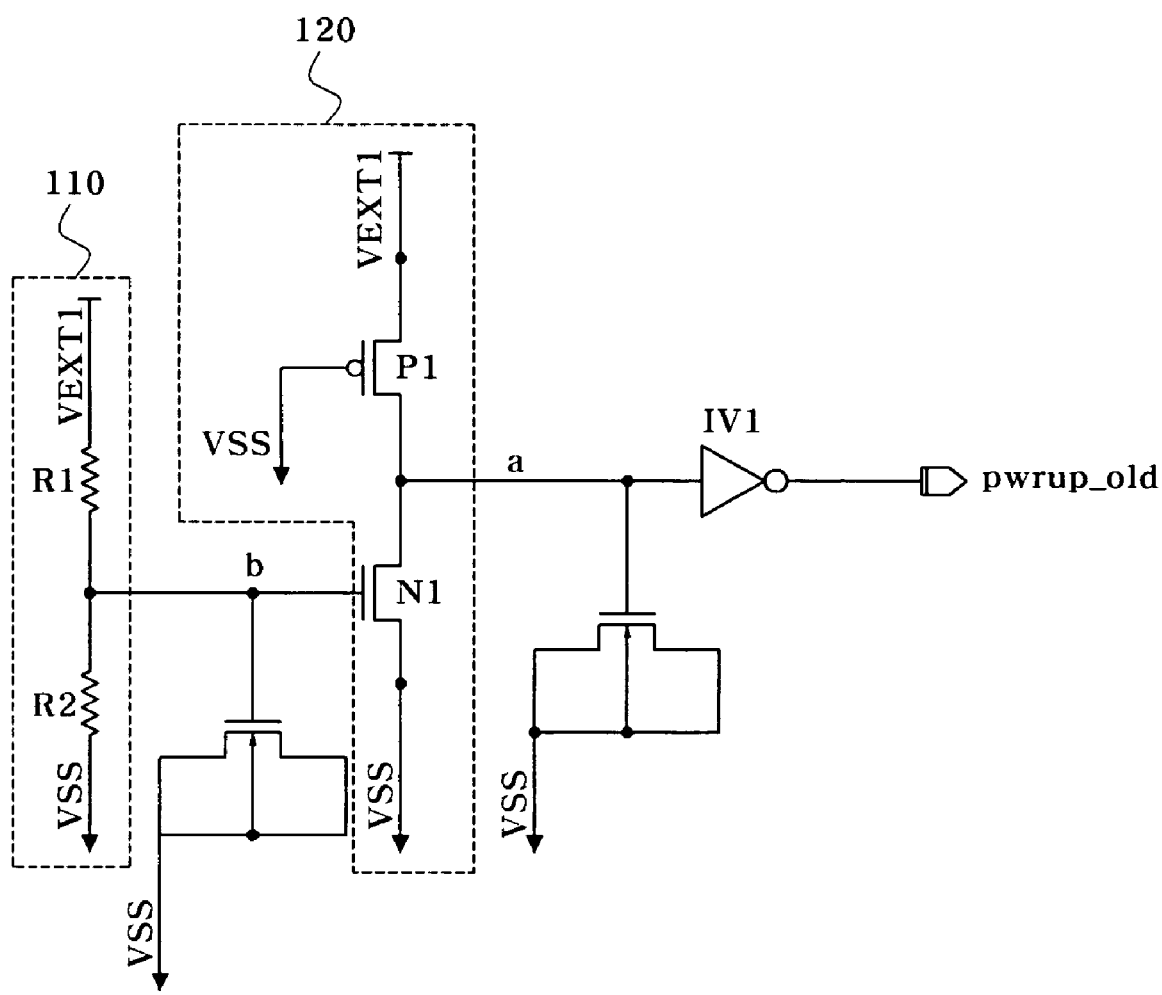
FIG. 2 illustrates a circuit diagram of the conventional initialization signal generating circuit shown in FIG. 1.
Figure 3:
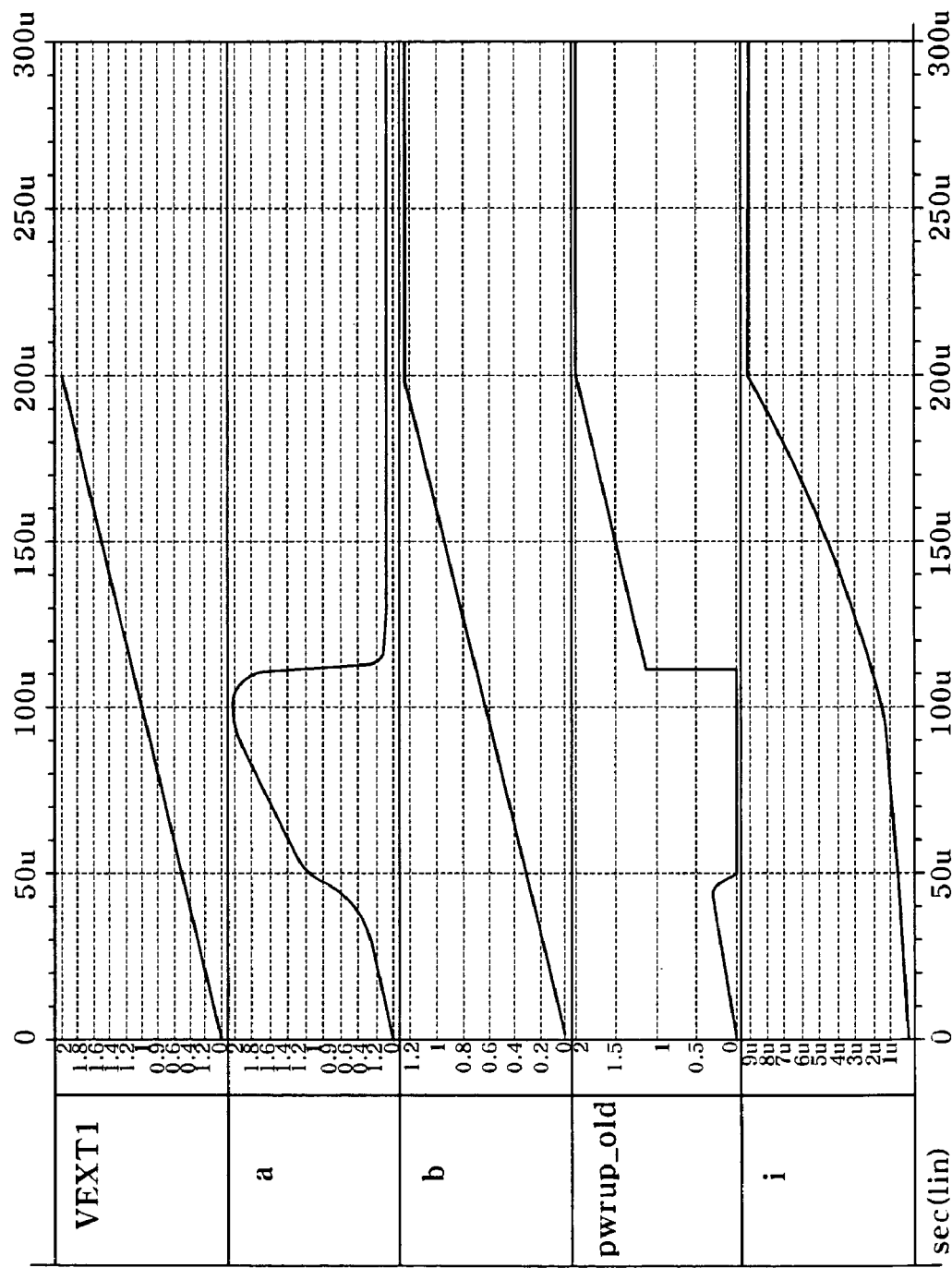
FIGS. 3 and 4 illustrate operation waveforms of the circuit shown in FIG. 2.
Figure 4:
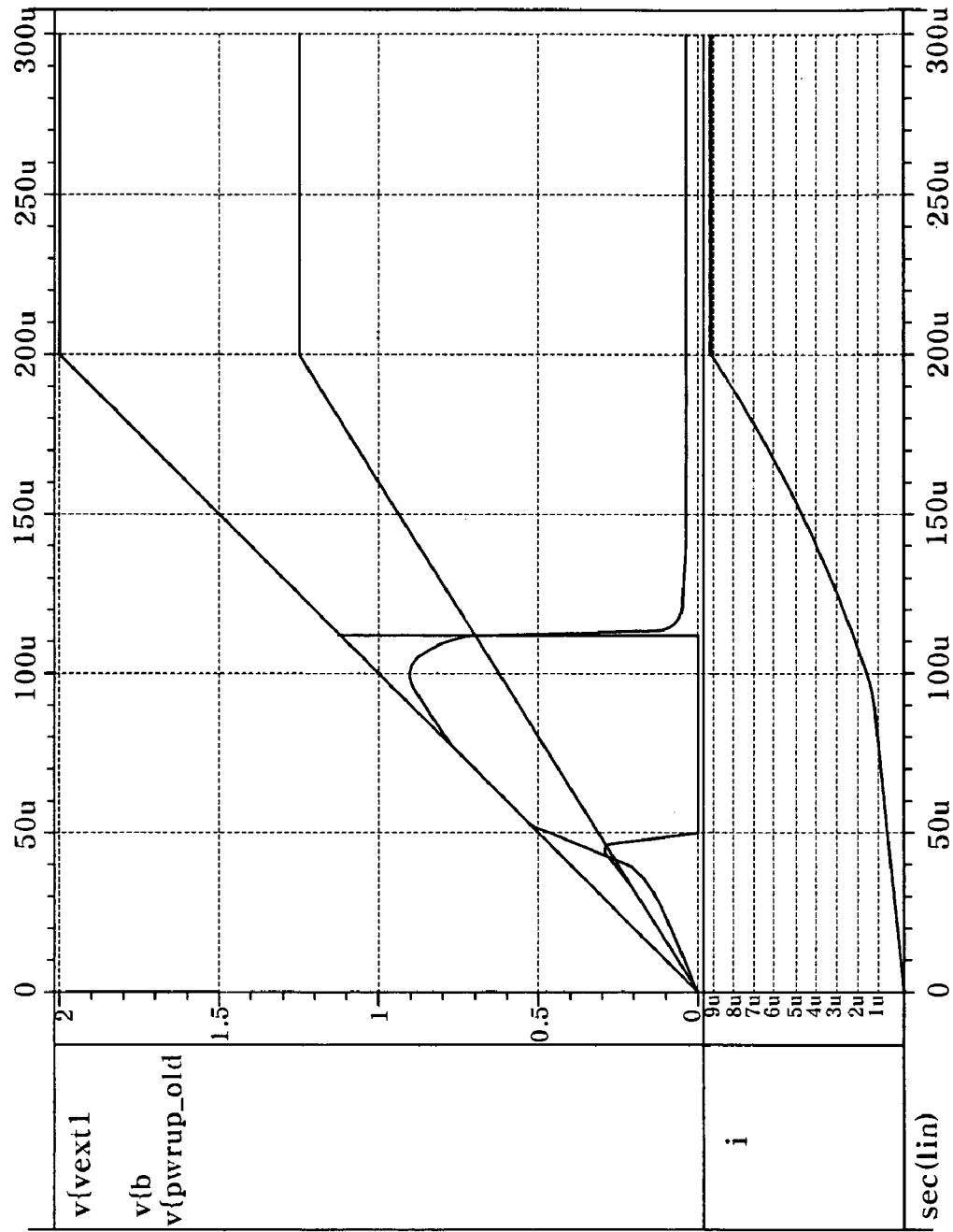
Figure 5:
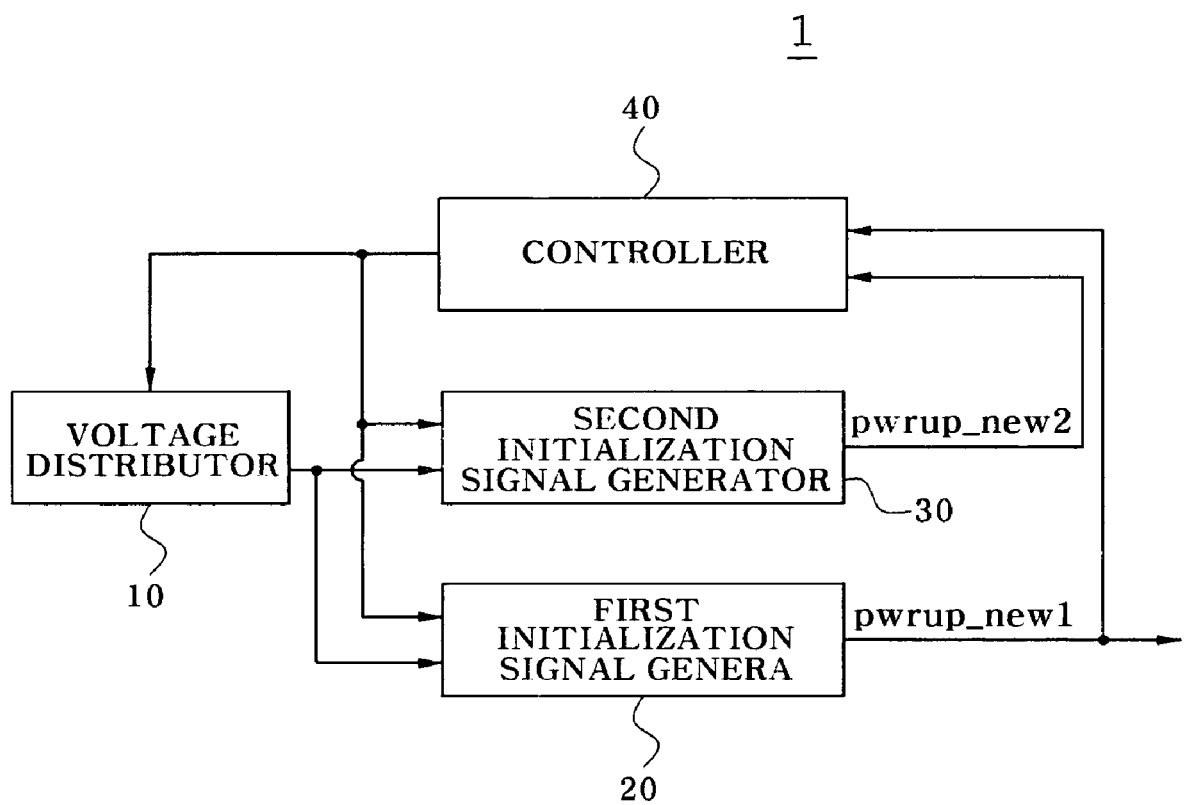
FIG. 5 illustrates a block diagram of an initialization signal generating circuit according to an exemplary embodiment of the present disclosure.
Figure 6:
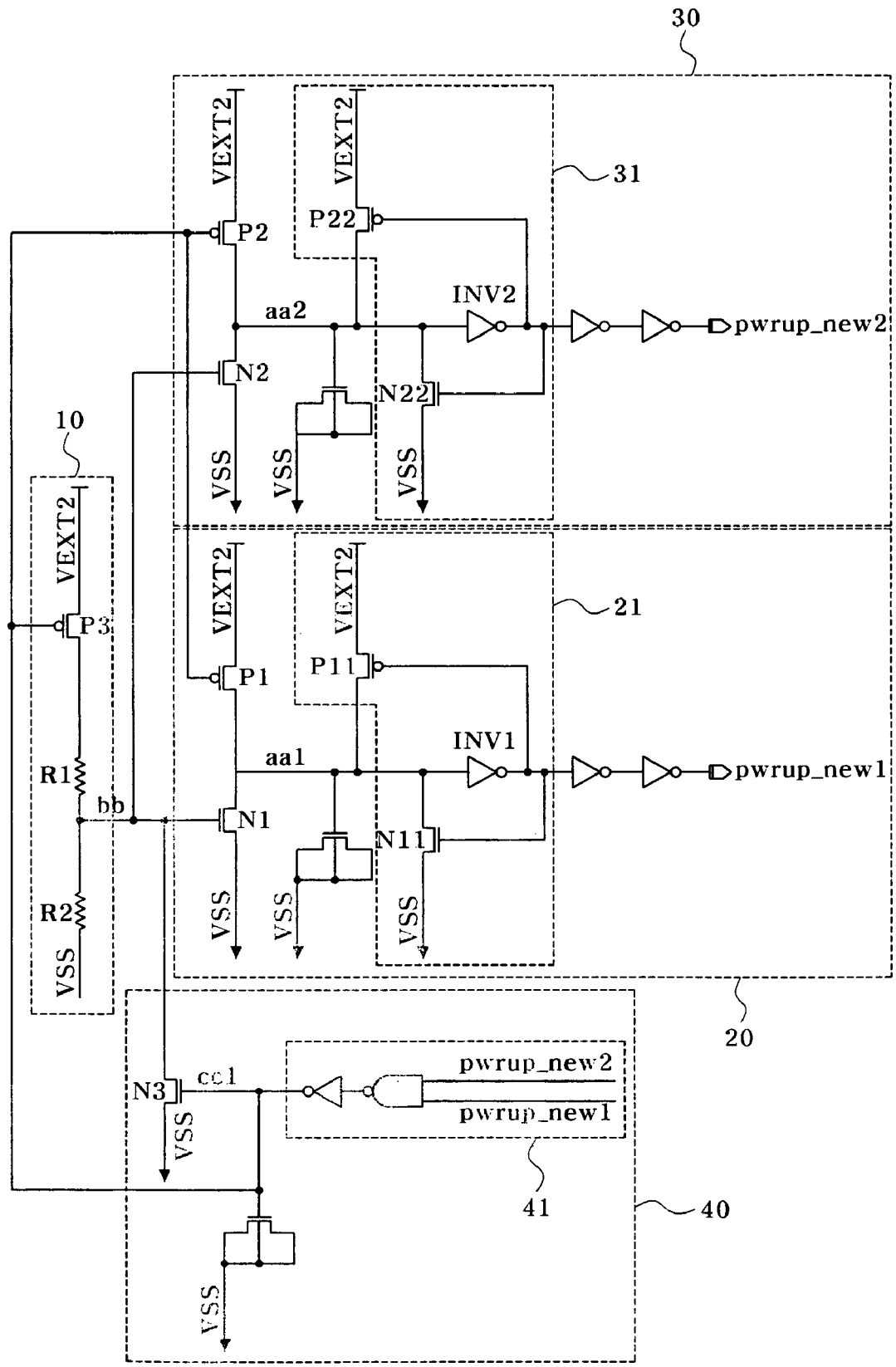
FIG. 6 illustrates a circuit diagram of the initialization signal generating circuit of FIG. 5.
Figure 7:
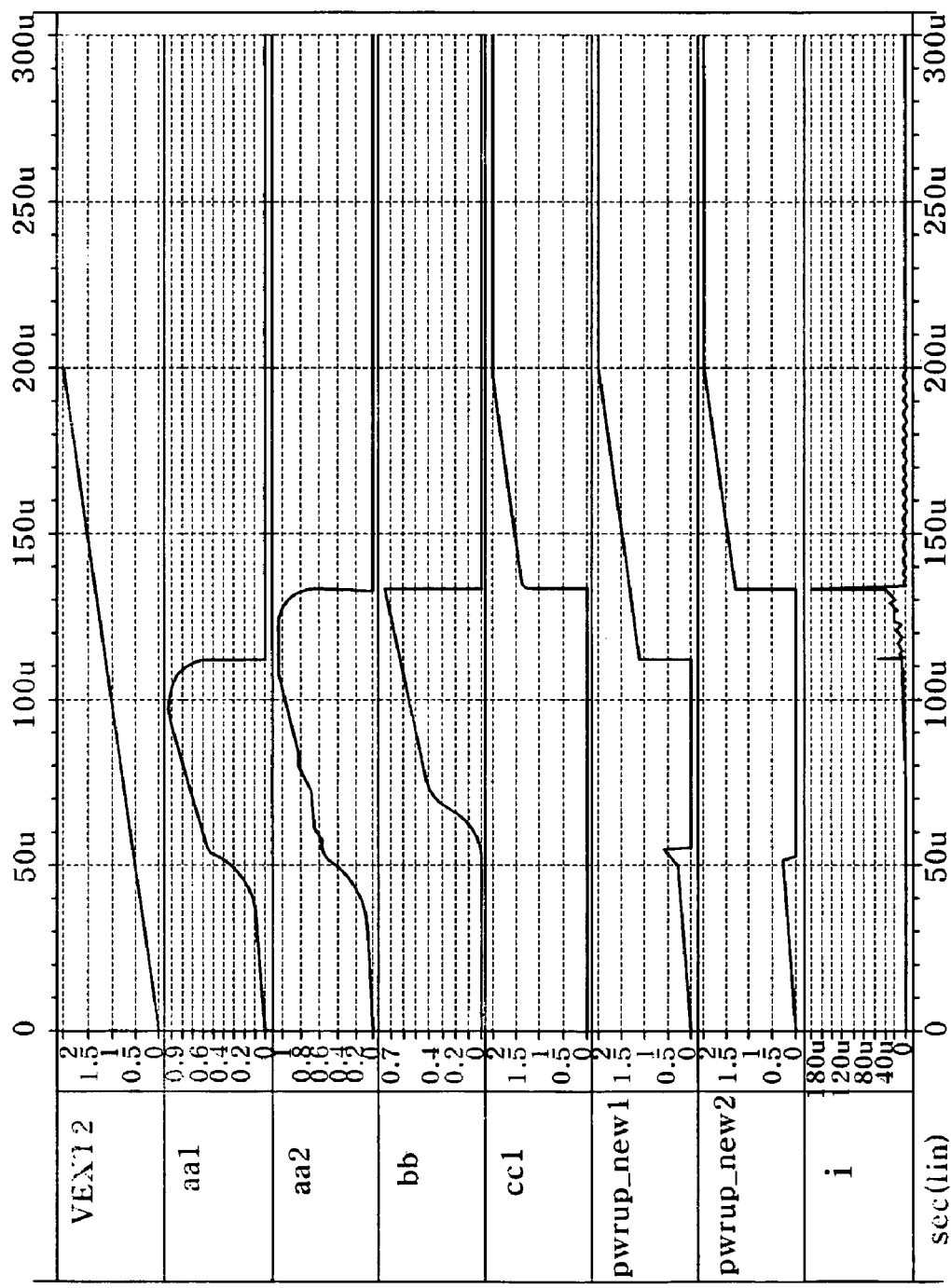
FIGS. 7 and 8 illustrate operation waveforms of the circuit shown in FIG. 6.
Figure 8:
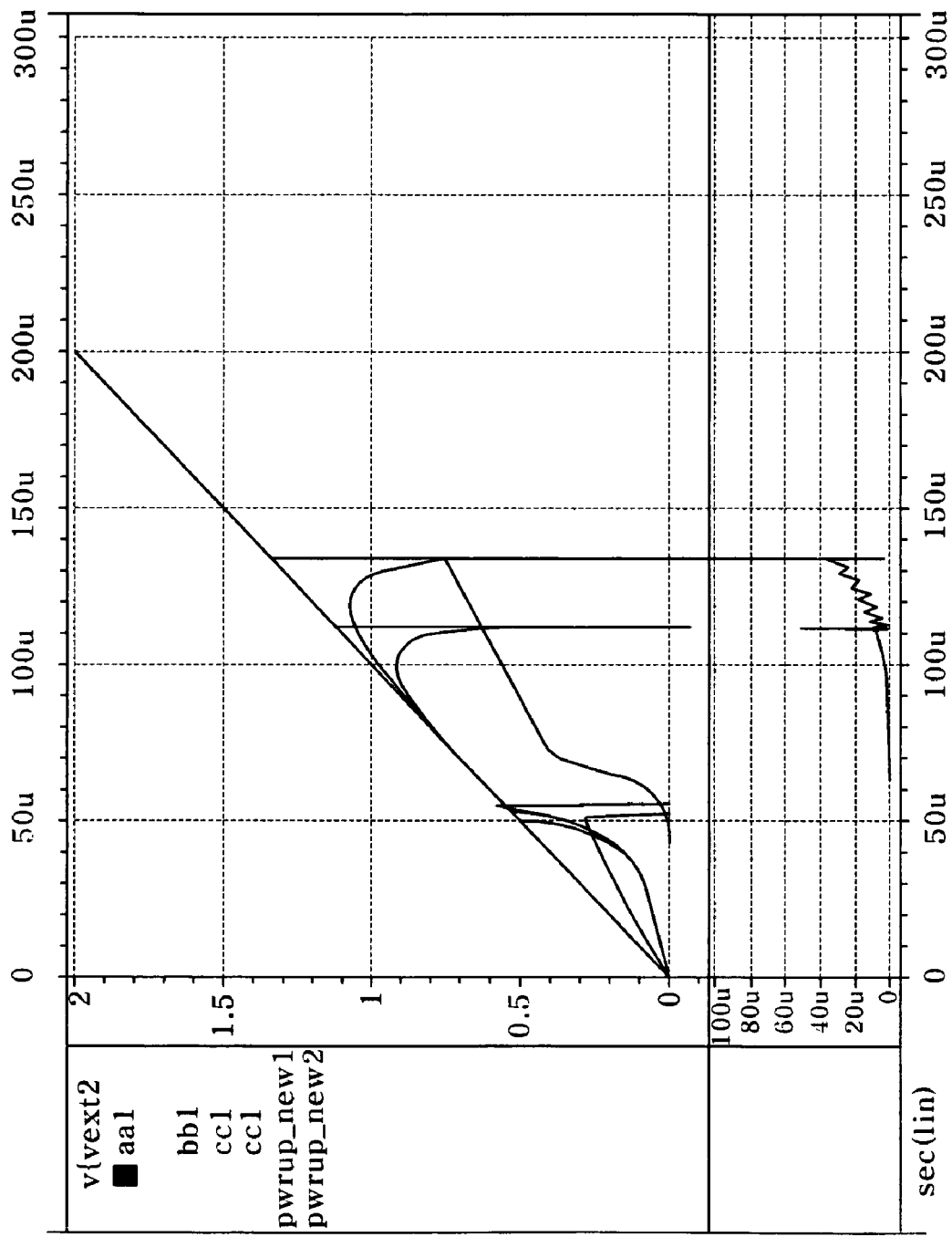

FIG. 5 illustrates a block diagram of an initialization signal generating circuit according to an exemplary embodiment of the present disclosure. FIG. 6 illustrates a circuit diagram of the initialization signal generating circuit of FIG. 5. FIGS. 7 and 8 illustrate operation waveforms of the circuit shown in FIG. 6.

Referring to FIG. 5, a semiconductor device 1 includes a voltage distributor 10, a first initialization signal generator 20, a second initialization signal generator 30, and a controller 40. The voltage distributor 10 outputs a voltage signal in response to an external voltage. The first initialization signal generator 20 outputs a first initialization signal pwrup_new1 in response to the voltage signal output from the voltage distributor 10. The second initialization signal generator 30 outputs a second initialization signal pwrup_new2 in response to the voltage signal output from the voltage distributor 10. The controller 40 blocks the external voltage supplied to the voltage distributor 10 and the first and second initialization signal generators 20 and 30, in response to the first and second initialization signals pwrup_new1 and pwrup_new2.

The voltage distributor 10 includes a driver P3 supplying the external voltage VEXT2 in response to an output signal of the controller 40, a first resistor R1 disposed between the driver P3 and a first node bb, and a second resistor R2 disposed between the first node bb and a ground terminal VSS.

The first initialization signal generator 20 includes a pull-down device N1 pulling down a second node aa1 in response to the voltage signal output from the voltage distributor 10, a pull-up device P1 pulling up the second node aa1 in response to an output signal of the controller 40, and a latch 21 latching output signals of the pull-down device N1 and the pull-up device P1.

The latch 21 includes an inverter INV1 inverting and outputting a signal of the second node aa1, a pull-up device P11 pulling up the second node aa1 in response to an output signal of the inverter INV1, and a pull-down device N11 pulling down the second node aa1 in response to the output signal of the inverter INV1.

The second initialization signal generator 30 includes a pull-down device N2 pulling down a third node aa2 in response to the voltage signal output from the voltage distributor 10, a pull-up device P2 pulling up the third node aa2 in response to the output signal of the controller 40, and a latch 31 latching output signals of the pull-down device N2 and the pull-up device P2.

The latch 31 includes an inverter INV2 inverting and outputting a signal of the third node aa2, a pull-up device P22 pulling up the third node aa2 in response to an output signal of the inverter INV2, and a pull-down device N22 pulling down the third node aa2 in response to an output signal of the inverter INV2.

The controller 40 includes a logic operator 41 performing an AND operation on the first initialization signal pwrup_new1 and a second initialization signal pwrup_new2, and a pull-down device N3 pulling down the first node bb in response to an output signal of the logic operator 41.

General operations of the subject matter of the present disclosure will be described with reference to FIGS. 5 to 8.

The subject matter of the present disclosure initializes an internal circuit through the first initialization signal pwrup_new1 when reaching an internal operation start voltage (e.g., approximately 1.2 V) in a case where an external voltage VEXT2 is applied from approximately 0 V to a predetermined value (e.g., approximately 2 V/approximately 200 µs) according to specifications, and then generates various internal voltages. At this point, the first initialization signal pwrup_ new1 must maintain a predetermined low or high logic level during a predetermined interval before reaching approximately 1.2 V. In an exemplary embodiment of the present disclosure, the first initialization signal pwrup_new1 maintains a low logic level.

As illustrated in FIGS. 5 and 6, once the external voltage VEXT2 is applied, a current supplied through the pull-up device P1 makes the second node aa1 high, and at this point, the first initialization signal pwrup_new1 is at a low level.

Next, when the external voltage VEXT2 is approximately 1.2 V, the level of the first node bb becomes high to turn on the pull-down device N1, such that the pull-down device N1 and the pull-up devices P1 and P11 are all turned on. As a result, the second node aa1 maintains its changed level, i.e., a low level, due to a transistor size ratio of the pull-up devices P1 and P11 and the pull-down device N1.

Thereafter, the first initialization signal pwrup_new1 becomes high to complete an initialization operation. The pull-down device N11 is turned on to form a latch structure together with the inverter INV1. Thus, although the pull-down device N1 is turned off later, the level of the first initialization signal pwrup_new1 can be maintained.

Once the external voltage VEXT2 is applied and the above operations start, a current supplied through the pull-up device P2 makes a level of the third node aa2 high, and at this point, the second initialization signal pwrup_new2 is at a low level. A turning point of the second initialization signal pwrup_ new2 is when a level higher than the level of the second node aa1 is reached by adjusting the size of the pull-up device P22. That is, the second initialization signal pwrup_new2 is activated after an elapse of a predetermined interval, following the first initialization signal pwrup_new1.

When the external voltage is approximately 1.3 V, the level of the first node bb becomes high to turn on the pull-down device N2, such that the pull-down device N2 and the pull-up devices P2 and P22 are all turned on. As a result, after a while, the third node aa2 maintains its changed level, i.e., a low level, due to a transistor size ratio of the pull-up devices P2 and P22 and the pull-down device N2.

Thereafter, the second initialization signal pwrup_new2 becomes high, and a fourth node cc1 changes to a high level together with the first initialization signal pwrup_new1 maintaining a high level.

Once the fourth node cc1 reaches a high level, it turns off the driver P3 of the voltage distributor 10, and then also the pull-down devices N1 and N2 of the first and second initialization signal generators 20 and 30, such that a current path passing the resistors R1 and R2 and the pull-down devices N1 and N2 is blocked. As a result, current consumption can be reduced. That is, when the first and second initialization signals pwrup_new1 and pwrup_new2 are all activated, the external voltage supplied to the voltage distributor 10 and the first and second initialization generators 20 and 30 is blocked to reduce current consumption.

In the examples and exemplary embodiments described above, when a predetermined voltage level is reached after the initialization signal is generated, current consumption can be reduced by blocking the external voltage supplied to the initialization signal generating circuit, and also the initialization signal can maintain its level through the latches.

While the present disclosure has been described with respect to specific examples and exemplary embodiments, it will be apparent to those skilled in the art that various changes and modifications may be made without departing from the spirit and scope of the disclosure and the following claims.

The present application claims priority to Korean patent application number 10-2007-0032313, filed on Apr. 2, 2007, the entire contents of which are incorporated herein by reference.

What is claimed is:

1. An initialization signal generating circuit, comprising:
   a voltage distributor configured to output a voltage signal in response to an external voltage;
   a first initialization signal generator configured to receive the external voltage and output a first initialization signal in response to the voltage signal outputted from the voltage distributor;
   a second initialization signal generator configured to receive the external voltage and output a second initialization signal in response to the voltage signal outputted from the voltage distributor; and
   a controller configured to block the external voltage supplied to the voltage distributor and the first and second initialization signal generators and to drive the voltage signal outputted from the voltage distributor to a ground level, in response to the first and second initialization signals.

2. The initialization signal generating circuit of claim 1, wherein the second initialization signal is activated after an elapse of a predetermined interval, following the first initialization signal.

3. The initialization signal generating circuit of claim 1, wherein the controller blocks the external voltage when the first and second initialization signals are activated.

4. The initialization signal generating circuit of claim 1, wherein the voltage distributor comprises:
   a driver configured to supply the external voltage in response to an output signal of the controller;
   a first resistor disposed between the driver and a first node; and
   a second resistor disposed between the first node and a ground terminal.

5. The initialization signal generating circuit of claim 1, wherein the first initialization signal generator comprises:
   a driver configured to pull down a second node in response to the output voltage signal of the voltage distributor, and pull up the second node to an external voltage level in response to an output signal of the controller; and
   a latch configured to latch an output signal of the driver.

6. The initialization signal generating circuit of claim 5, wherein the driver comprises:
   a pull-down device configured to pull down the second node in response to the voltage signal output from the voltage distributor; and
   a pull-up device configured to pull up the second node in response to the output signal of the controller.

7. The initialization signal generating circuit of claim 5, wherein the latch comprises:
   an inverter configured to invert and output the output signal of the driver;
   a pull-up device configured to pull up the second node in response to an output signal of the inverter; and
   a pull-down device configured to pull down the second node in response to the output signal of the inverter.

8. The initialization signal generating circuit of claim 1, wherein the second initialization signal generator comprises:
   a driver configured to pull down a third node in response to the output voltage signal of the voltage distributor, and pull up the third node in response to an output signal of the controller; and
   a latch configured to latch an output signal of the driver.

9. The initialization signal generating circuit of claim 8, wherein the driver comprises:
   a pull-down device configured to pull down the third node in response to the voltage signal output from the voltage distributor; and
   a pull-up device configured to pull up the third node in response to the output signal of the controller.

10. The initialization signal generating circuit of claim 8, wherein the latch comprises:
    an inverter configured to invert and output the output signal of the driver;
    a pull-up device configured to pull up the third node in response to an output signal of the inverter; and
    a pull-down device configured to pull down the third node in response to the output signal of the inverter.

11. The initialization signal generating circuit of claim 1, wherein the controller comprises:
    a logic operator configured to perform an AND operation on the first and second initialization signals; and
    a pull-down device configured to pull down an output terminal of the voltage distributor in response to an output signal of the logic operator.

12. An initialization signal generating circuit comprising:
    a voltage distributor configured to distribute an external voltage according to resistances of a first resistor and a second resistor to output a voltage signal;
    an initialization signal generator configured to receive the external voltage and output an initialization signal in response to the voltage signal outputted from the voltage distributor; and
    a controller configured to block the external voltage supplied to the voltage distributor and the initialization signal generator and to drive the voltage signal outputted from the voltage distributor to a ground level, in response to the initialization signal.

13. The initialization signal generating circuit of claim 12, wherein the voltage distributor comprises:
    a driver configured to supply the external voltage in response to an output signal of the controller;
    the first resistor disposed between the driver and a first node; and
    the second resistor disposed between the first node and a ground terminal.

14. The initialization signal generating circuit of claim 12, wherein the controller blocks the external voltage when the initialization signal is activated.

15. The initialization signal generating circuit of claim 12, wherein the controller comprises:
    a logic operator configured to perform an AND operation on the initialization signal; and
    a pull-down device configured to pull down an output terminal of the voltage distributor in response to an output signal of the logic operator.

16. The initialization signal generating circuit of claim 12, wherein the initialization signal generator comprises:
    a driver configured to operate in response to output signals of the voltage distributor and the controller;
    a latch configured to latch an output signal of the driver; and
    a buffer configured to buffer an output signal of the latch.

17. The initialization signal generating circuit of claim 16, wherein the driver comprises:
    a pull-down driver configured to pull down a predetermined node in response to the voltage signal output from the voltage distributor; and
    a pull-up driver configured to pull up the predetermined node in response to an output signal of the controller.

18. The initialization signal generating circuit of claim 16, wherein the latch comprises:
- an inverter configured to invert and output the output signal of the driver;
- a pull-up driver configured pull up an output terminal of the driver in response to the output signal of the inverter; and
- a pull-down driver configured to pull down the output terminal of the driver in response to an output signal of the inverter.

* * * * *